United States Patent [19]

Imazeki et al.

[11] 4,158,814
[45] Jun. 19, 1979

[54] AUTOMATIC OVERLOAD PROTECTION SYSTEM

[75] Inventors: Kazuyoshi Imazeki; Koichi Kazami, both of Tokyo, Japan

[73] Assignee: General Research of Electronics, Inc., Tokyo, Japan

[21] Appl. No.: 831,420

[22] Filed: Sep. 8, 1977

[51] Int. Cl.² .................. H04B 1/10; H04B 1/18
[52] U.S. Cl. .................. 325/362; 325/380; 325/381; 325/384; 325/413
[58] Field of Search ............. 325/362, 401, 412, 413, 325/380, 381, 384, 387, 319

[56] References Cited

U.S. PATENT DOCUMENTS

| | | | |
|---|---|---|---|
| 3,255,415 | 6/1966 | Baur | 325/401 |
| 3,581,210 | 5/1971 | Amfahr | 325/362 |
| 3,600,684 | 8/1971 | Cherry | 325/362 |
| 3,622,887 | 11/1971 | Byles | 325/362 |

*Primary Examiner*—Marc E. Bookbinder
*Attorney, Agent, or Firm*—Olson, Trexler, Wolters, Bushnell & Fosse, Ltd.

[57] ABSTRACT

A variable impedance circuit is included between the antenna and the RF amplifier stage of a radio receiver portion of a transceiver and is responsive to a phase-inverted and amplified AGC signal to automatically protect the receiver from breaking down or otherwise malfunctioning when it receives an over-input or excessive input signal level. When the input signal level to the receiver is at the typical operating level, the circuit provides a substantially infinite impedance to ground so as not to interfere with signal transmission from the antenna to the input stage and the successive stages. The impedance to ground of the circuit decreases as the input signal level increases and, when an excessive input signal level sufficient to cause receiver breakdown or malfunction is applied to the circuit, the impedance to ground of the variable impedance reaches an almost zero level, thereby shunting to ground and thus harmlessly dissipating the excessive signal level input to the receiver before it can burn out or otherwise damage the input or subsequent circuitry or cause a malfunction thereof.

2 Claims, 2 Drawing Figures

AUTOMATIC OVERLOAD PROTECTION SYSTEM

BACKGROUND OF THE INVENTION

The present invention relates to an automatic overload protection system for a radio receiver and, more particularly, to such a system which is particularly adapted to protect the input circuitry of the receiving portion of a radio transceiver from damage or malfunction.

A radio system such as a transceiver and especially a portable transceiver is commonly used under circumstances where the intensity of an input signal to the receiver portion thereof varies considerably. To accommodate such signal strength variation, a circuit commonly referred to as an automatic gain control (AGC) circuit is typically employed. The AGC circuit varies the bias of the amplifying transistor(s) of the input stage(s) to increase the gain for weak input signals and decrease it for strong signals. If a relatively very high level signal is applied to the input, the AGC circuit will decrease the gain but the input circuitry (particularly the amplifying transistors) may still be damaged by the excessive power of the signal.

This situation can occur in any radio, of course, but it is especially likely in a radio transceiver when the transceiver is rapidly switched from the transmit mode to the receive mode. If the transmit circuitry remains active when the receive circuitry is activated, even if the overlap is only momentarily, the input circuitry of the receiver may be damaged by the overload because the conventional automatic gain control circuit provides inadequate protection of the receiver in that it does not harmlessly dissipate the excess energy.

It is therefore an object of the invention to provide a new and improved system for protecting the input of a radio circuit from damage or malfunction caused by excessively high input signals.

It is another object of the invention to provide such a system which is particularly adaptable to a radio transceiver.

It is yet another object of the invention to provide such a system which overcomes the inability of conventional AGC circuits to adequately protect an input circuit from excessively high, potentially damaging input signals.

SUMMARY OF THE INVENTION

A system for automatically protecting the input circuitry of an electronic radio receiver from damage or malfunction caused by the application to the receiver of an input signal having a magnitude so large as to possibly damage said input circuit comprises means coupled to the input circuitry and responsive to the magnitude of the input signal for developing a corresponding control signal. Also provided are variable impedance means connected to the input of the circuit and responsive to the control signal for varying the impedance of the variable impedance means in accordance with the magnitude of the input signal, whereby the variable impedance means harmlessly dissipates the energy resulting from excessively strong input signals before such signals can damage the input circuit.

The features of the present invention which are believed to be novel are set forth with particularity in the appended claims. The organization and manner of operation of the invention, together with further objects and advantages thereof, may best be understood by reference to the following description taken in connection with the accompanying drawings in the several figures of which like reference characters identify like elements, and in which:

FIG. 1 is a block diagram of a preferred embodiment of an automatic overload protection system constructed in accordance with the principles of the present invention; and FIG. 2 is an electrical schematic diagram of a circuit utilized in the preferred embodiment of the invention illustrated in FIG. 1.

DESCRIPTION OF THE PREFERRED EMBODIMENT

Figure 1:
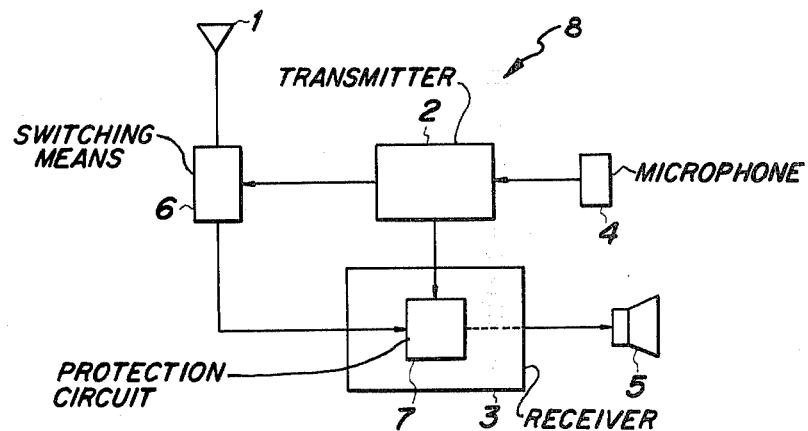

Referring to the block diagram of FIG. 1, a transceiver 8 includes transmitter circuitry 2, receiver circuitry 3, a microphone 4, a speaker 5, transmit-receive switch means 6 and an antenna 1, all of known construction. It is understood, of course, that although the invention is described herein particularly with reference to a radio transceiver such as a citizen's band (CB) transceiver, the principles involved may be applied to various types of radio frequency devices where damage to the input circuitry or malfunction thereof may be caused by high level input signals.

In general, when transmitter circuitry 2 is in operation, as determined by switching means 6, sounds provided to the microphone 4 are transmitted from the antenna 1 in the form of high-frequency electric signals modulated by the transmitter circuitry 2. When the receiver 3 circuitry is in operation, high-frequency electric signals received by the antenna 1 are demodulated by the receiver circuitry 3 to be reproduced as audio sounds from the speaker 5. Again, since all the foregoing components, including the switch 6 for switching between the transmitter circuitry 2 and the receiver circuitry 3, are known in the art, detailed description herein of the construction and operation of the individual parts is unnecessary.

In the transceiver 8 of the above-described type, the receiver circuitry 3 and the transmitter circuitry 2 are not intentionally activated at the same time, but should their operations coincide due to some inadvertency, the relatively very strong signals emitted from the transmitter circuitry 2 will be directly received by the receiver circuitry 3, causing its circuits to overload or even burn out because of the high power involved.

In accordance with the invention, a system 7 is provided for automatically protecting the input circuitry of an electronic radio receiver from damage or malfunction caused by the application to the receiver of a signal having a magnitude so large as to possibly damage said input circuit. In general, the system 7 comprises means coupled to the input circuitry and responsive to the magnitude of the input signal for developing a corresponding control signal, which means may include a conventional AGC circuit together with a phase-inverting and amplifying stage as discussed hereinbelow in greater detail with reference to FIG. 2. System 7 also includes variable impedance means connected to the input of receiver circuitry 3 and responsive to the control signal for varying the impedance of the variable impedance means in accordance with the magnitude of the input signal, as also discussed in greater detail in connection with FIG. 2, whereby the variable impedance means harmlessly dissipates the energy resulting from excessively strong input signals before such signals can damage the input circuitry or cause malfunction thereof.

Figure 2:
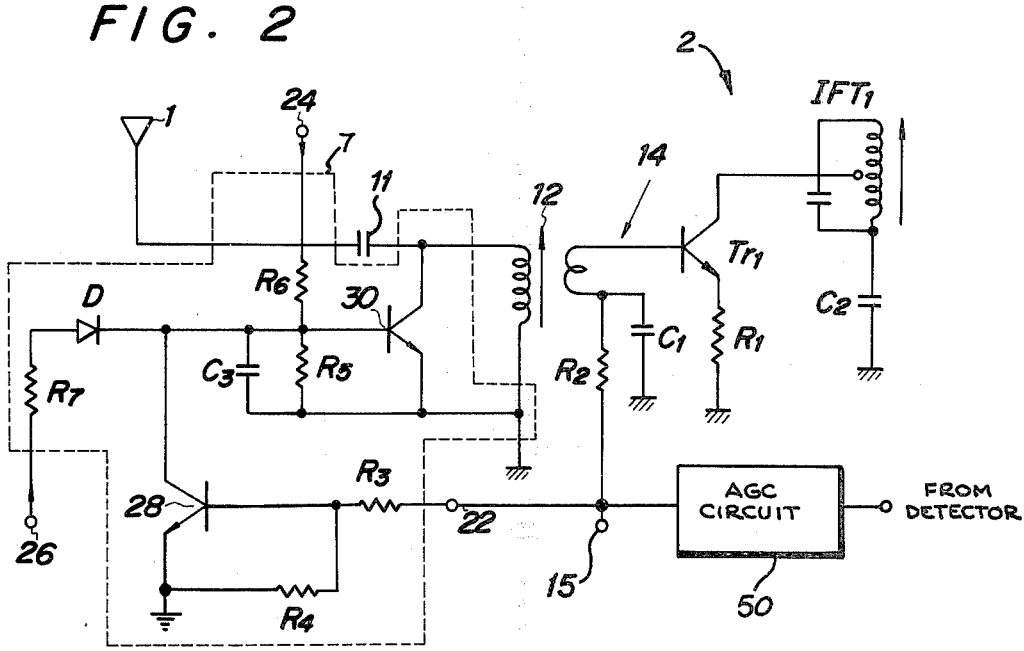

With reference to FIG. 2, there is shown an electrical schematic diagram of a circuit utilized in the preferred embodiment of the invention illustrated in FIG. 1. The circuit of FIG. 2 includes a typical "front end" or a radio receiver or the receiver circuitry of a transceiver and comprises an antenna 1, a high-frequency or "RF" amplifying stage 14, and the input transformer IFT$_1$ of an intermediate frequency or "IF" stage (not completely shown), all of which are conventional. Antenna 1 receives input signals and applies them to the base of amplifying transistor Tr$_1$ of RF stage 14 via coupling capacitor 11 and a tuned input transformer 12. A suitable supply voltage (e.g. +8 volts) is applied to amplifying stage 14 in a conventional manner (not shown) when the transceiver is in the receive mode. When the transceiver is in a transmit mode, the supply voltage is removed from stage 14 and often succeeding stages as well. An AGC circuit 50 is provided to respond to the detector (not shown) and develop a DC signal which varies inversely with the strength of the signal at antenna 1, in the customary manner. The AGC signal is applied to the base of amplifying transistor Tr$_1$ via resistor R$_2$ and the secondary winding of tuned input transformer 12 to thus vary the gain of the transistor Tr$_1$ in accordance with the strength of the input signal at antenna 1.

In accordance with the embodiment of the invention illustrated in FIG. 2, means including a phase-inverting and amplifying transistor 28 are coupled to the input circuitry of the receiver (i.e. input transformer 12), by way of AGC circuit 50, the detector and other stages following amplifying stage 14 (all not shown), and amplifying stage 14, and are responsive to the magnitude of the input signal for developing a corresponding control signal. The control signal is developed at the collector of transistor 28 and, in the illustrated embodiment of the invention, is a DC signal having a magnitude that increases as the magnitude of the input signal increases.

The control signal thus developed is applied to a variable impedance means to vary its impedance in accordance with the magnitude of the input signal. In the embodiment of the invention illustrated in FIG. 2, the variable impedance takes the form of an NPN transistor 30 having its emitter-collector junction coupled in parallel with the input transformer and having its base coupled to the control signal developed at the collector of transistor 28. Hence, excessive input signals cause the system of the invention to effectively by-pass the excessive, potentially damaging energy around the input circuit to prevent damage to the input circuit. In other words, as long as the input signal is within the normal operating range, the control signal is low and the emitter-collector junction impedance of transistor 30 is relatively very high (i.e. an open circuit for all practical purposes). When the input signal exceeds the normal operating range, however, the control signal increases (i.e. in the embodiment shown in FIG. 2, transistor 28 biased towards its off state so that the impedance from the base of transistor 30 to ground through transistor 28 increases) to thus turn on transistor 30 and by-pass or shunt the excessive signal around the input circuit and thereby dissipate the excess energy. As the input signal gets stronger, the shunting effect increases. The automatic dissipation of excess input signal energy could alternatively be accomplished by using variable-impedance transistor 30 in series between antenna 1 and transformer 12 and reversing the polarity of the control signal.

The overload protection system 7 of the embodiment of the invention illustrated in FIG. 2 is initially biased by applying a suitable supply of voltage (e.g. +8 volts) to terminal 24 and a voltage divider network comprising resistor R$_5$ and R$_6$. In accordance with another aspect of the invention, means including a current-limiting resistor R$_7$ and a diode D are provided for applying an externally-developed control signal (e.g. the supply voltage used to enable the transmitter circuitry which also may be selectively applied to terminal 26) to the variable impedance means (i.e. transistor 30), whereby the automatic circuit protecting system may be overridden manually or in response to a predetermined external event (e.g. the enabling of the transmitter circuitry).

Thus there has been shown and described a new and improved system for automatically protecting radio receiver input circuitry from damage or malfunction caused by an excessively strong input signal. The system utilizes a relatively simple and inexpensive circuit to by-pass and harmlessly dissipate the energy of an excessively strong input signal to thus protect the input circuitry from being burned out or otherwise damaged, or being caused to malfunction. The system of the invention offers significant improvement over conventional AGC systems which merely adjust the gain of the input stage(s) but do not by-pass or dissipate the excess energy, thus permitting damage to the receiver.

While particular embodiments of the invention have been shown and described in detail, it will be obvious to those skilled in the art that changes and modifications of the present invention, in its various aspects, may be made without departing from the invention in its broader aspects, some of which changes and modifications being matters of routing engineering or design and others being apparent only after study. As such, the scope of the invention should not be limited by the particular embodiment and specific construction described herein but should be defined by the appended claims and equivalents thereof. Accordingly, the aim in the appended claims is to cover all such changes and modifications as fall within the true spirit and scope of the invention.

The invention is claimed as follows:

1. A system for automatically protecting the input circuitry of an electronic radio receiver from damage or malfunction caused by the application to said receiver of an input signal having a magnitude so large as to possibly damage said input circuitry, said system comprising: means, including an AGC circuit for generating an AGC signal and a phase-inverting circuit coupled to said AGC circuit for inverting the phase of said AGC signal, said means being responsive to the magnitude of a receiver produced signal indicative of input signal level for developing said AGC signal and a control signal comprising said phase-inverted AGC signal; variable impedance means, including a transistor having its emitter-collector junction coupled to and in parallel with said input circuitry and having its base coupled to said control signal, said variable impedance means responsive to said control signal for varying the impedance thereof in accordance with the magnitude of said receiver produced signal, whereby the variable impedance means harmlessly dissipates the energy resulting from excessively strong input signals before such signals can damage the input circuitry.

2. A system in accordance with claim 1, in which said radio receiver further includes transmitter circuitry and in which said system further comprises means for applying an externally developed control signal to said variable impedance means whenever the transmitter circuitry is operated, whereby the automatic input circuit protecting system may be operated automatically in response to operation of the transmitter portion of the transceiver.

* * * * *